US007852149B1

(12) United States Patent
Wagner

(10) Patent No.: US 7,852,149 B1
(45) Date of Patent: Dec. 14, 2010

(54) QUADRATURE ENVELOPE ELIMINATION AND RESTORATION (EER) AMPLIFIER

(75) Inventor: Paul K. Wagner, Marion, IA (US)

(73) Assignee: Rockwell Collins, Inc., Cedar Rapids, IA (US)

( * ) Notice: Subject to any disclaimer, the term of this patent is extended or adjusted under 35 U.S.C. 154(b) by 104 days.

(21) Appl. No.: 12/220,199

(22) Filed: Jul. 22, 2008

(51) Int. Cl.
H03F 3/38 (2006.01)
H03F 3/68 (2006.01)

(52) U.S. Cl. .................. 330/10; 330/124 R; 330/136

(58) Field of Classification Search .............. 330/10, 330/124 R, 136
See application file for complete search history.

(56) References Cited

U.S. PATENT DOCUMENTS 6,998,914 B2 * 2/2006 Robinson ............... 330/124 R
2009/0311980 A1 * 12/2009 Sjoland .................. 455/127.3

OTHER PUBLICATIONS

Cox, D., et al., "A VHF Implementation of a LINC Amplifier", IEEE Transactions on Communications, Sep. 1976; pp. 1018-1022; Communications, vol. 24, Issue 9.
Hegazi, G.M., et al., "Improved LINC Power Transmission Using a Quadrature Outphasing Technique", Microwave Symposium Digest, 2005 IEEE MTT-S International; Jun. 12-17, 2005; pp. 1923-1926.
Marco, L., et al., "Effects of Switching Power Converter Nonidealities in Envelope Elimination and Restoration Technique", 2006 IEEE International Symposium on Circuits and Systems; May 21-24, 2006; pp. 3137-3140.
Raab, F.H., et al., "High-Efficiency Single-Sideband HF/VHF Transmitter Based Upon Envelope Elimination and Restoration", Sixth International Conference on HF Radio Systems and Techniques, 1994; Jul. 4-7, 1994; pp. 21-25.
Yao, J., et al., "Power Amplifier Selection for LINC Applications", IEEE Transactions on Circuits and Systems-II: Express Briefs; Aug. 2006; pp. 763-767; vol. 53, No. 8.

* cited by examiner

*Primary Examiner*—Steven J Mottola
(74) *Attorney, Agent, or Firm*—Matthew J. Evans; Daniel M. Barbieri

(57) ABSTRACT

The present invention is a system for amplifying a signal input. The system may include a signal separator. The signal separator may be configured for receiving the signal input and separating the signal input to form a first component, a second component, a third component, and a fourth component. The system may further include a first modulator. The first modulator may be configured for being connected to the signal separator and may be further configured for receiving and amplifying the first component to form a first modulator output. The system may further include a second modulator. The second modulator may be configured for being connected to the signal separator and may be further configured for receiving and amplifying the second component to form a second modulator output.

17 Claims, 2 Drawing Sheets

QUADRATURE ENVELOPE ELIMINATION AND RESTORATION (EER) AMPLIFIER

FIELD OF THE INVENTION

The present invention relates to the field of Software Defined Radio (SDR) (including waveforms) and particularly to a topology/architecture for a Quadrature Envelope Elimination and Restoration (EER) Amplifier and a method for implementing same.

BACKGROUND OF THE INVENTION

A number of currently available Radio Frequency (RF) power amplifiers may not provide a desired level of Direct Current (DC) power efficiency, output signal purity, and/or spectral efficiency.

Thus, it would be desirable to provide an amplifier topology which obviates the above-referenced problems associated with currently available amplifiers.

SUMMARY OF THE INVENTION

Accordingly, an embodiment of the present invention is directed to a system for amplifying a signal input, including: a signal separator configured for receiving the signal input and separating the signal input to form a first component, a second component, a third component, and a fourth component; a first modulator configured for being connected to the signal separator, the first modulator being further configured for receiving the first component and amplifying the first component to form a first modulator output; and a second modulator configured for being connected to the signal separator, the second modulator being further configured for receiving the second component and amplifying the second component to form a second modulator output.

An additional embodiment of the present invention is directed to a method for amplifying a signal input, including: receiving the signal input; separating the signal input to form a first component, a second component, a third component, and a fourth component; amplifying the first component to form a first modulator output; and amplifying the second component to form a second modulator output.

A further embodiment of the present invention is directed to a system for amplifying a signal input, including: a signal separator configured for receiving the signal input and separating the signal input to form a first component, a second component, a third component, and a fourth component; a first modulator configured for being connected to the signal separator, the first modulator being further configured for receiving the first component and amplifying the first component to form a first modulator output; a second modulator configured for being connected to the signal separator, the second modulator being further configured for receiving the second component and amplifying the second component to form a second modulator output; a first saturated amplifier configured for being connected to the signal separator and the first modulator, the first saturated amplifier being further configured for receiving the third component and increasing a power level of the third component to form a first amplifier output; and a second saturated amplifier configured for being connected to the signal separator and the second modulator, the second saturated amplifier being further configured for receiving the fourth component and increasing a power level of the fourth component to form a second amplifier output.

It is to be understood that both the foregoing general description and the following detailed description are exemplary and explanatory only and are not necessarily restrictive of the invention as claimed. The accompanying drawings, which are incorporated in and constitute a part of the specification, illustrate embodiments of the invention and together with the general description, serve to explain the principles of the invention.

BRIEF DESCRIPTION OF THE DRAWINGS

The numerous advantages of the present invention may be better understood by those skilled in the art by reference to the accompanying figures in which.

DETAILED DESCRIPTION OF THE INVENTION

In a number of currently available Envelope Elimination and Restoration (EER) Amplifiers, the carrier may be a hard-limited version of a constant-envelope Frequency Modulation (FM) and/or Phase Modulation (PM) sinusoid. The hysteresis, jitter and noise of analog circuits used to generate such a signal may result in distortion and noise at the Power Amplifier (PA) output. In the Quadrature Envelope Elimination and Restoration Amplifier (QEA) of the present invention, a digitally-implemented phasor generator may replace the non-ideal analog circuits in a carrier signal processing path.

Further, in a number of currently available EER Amplifiers, the fundamental to total power ratio (FTPR) at the PA output, prior to output filtering, may be 81% due to representing the carrier with a 2-state signal. In the QEA of the present invention, the FTPR may be 93% due to representing the carrier as a phasor with 3-state signals. Thus, the QEA of the present invention may promote increased power efficiency and may further promote reduced generation of waste heat in the output duplexer Highpass Filter (HPF) and harmonic dumping load. Additionally, the QEA design/topology of the present invention may include/provide a 4 sample per cycle carrier phasor signal which may be easy to implement digitally and easy to modify to accommodate unipolar modulators. Still further, the QEA design/topology of the present invention may have potentially beneficial applications in portable and battery-operated Radio Frequency (RF) communications equipment, such as where high spectral purity and high Direct Current (DC)-to-RF conversion efficiency are required.

Reference will now be made in detail to the presently preferred embodiments of the invention, examples of which are illustrated in the accompanying drawings.

Figure 1:
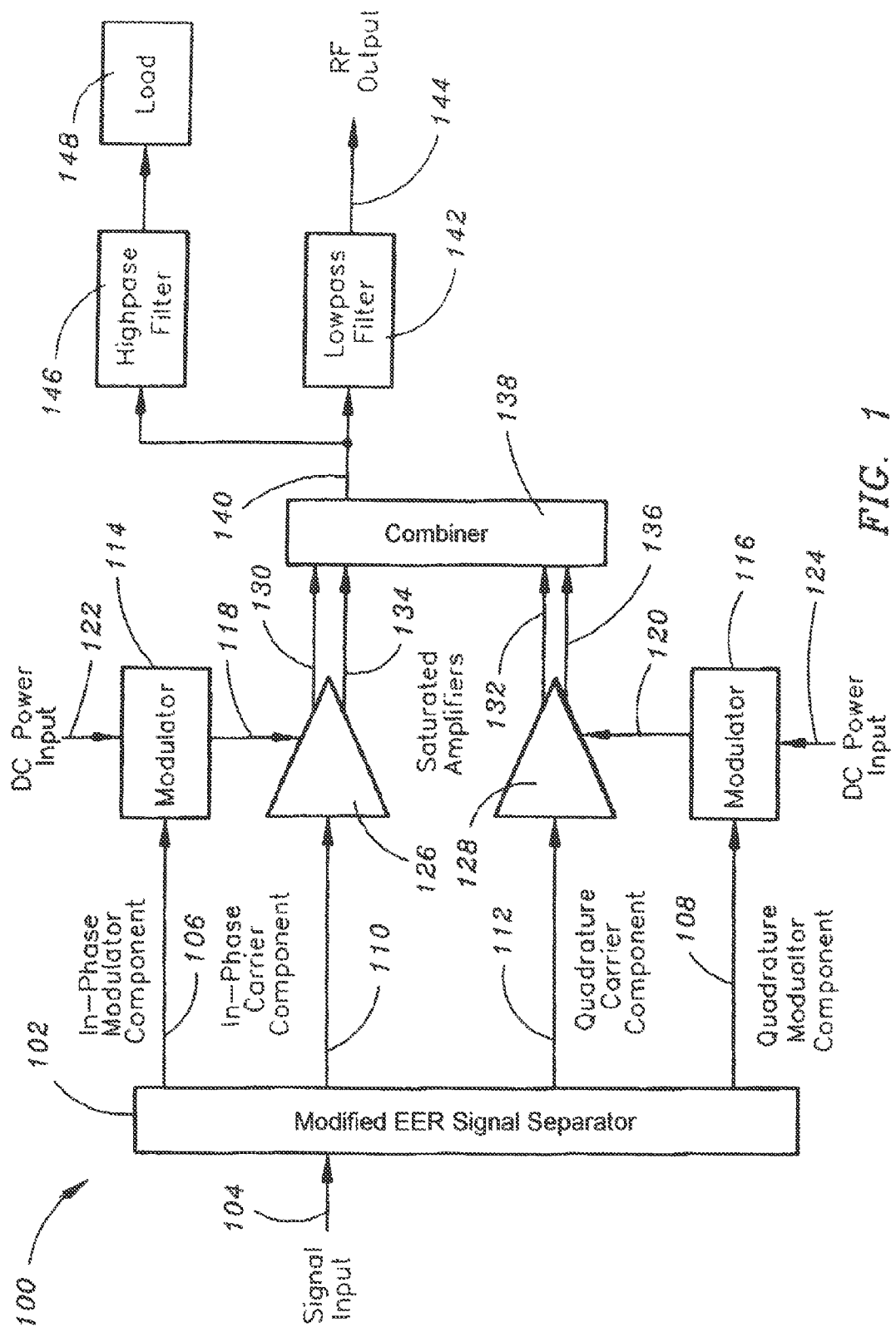
FIG. 1 is a block diagram of a system for amplifying a signal input in accordance with an exemplary embodiment of the present invention.

Referring generally to FIG. 1, a system for amplifying a signal input in accordance with an exemplary embodiment of the present invention is shown. For example, the system 100 may be a QEA system/topology. In exemplary embodiments, the system 100 may include a signal separator 102. For instance, the signal separator may be a modified EER signal separator. The signal separator 102 may be configured for receiving the signal input 104 and separating/processing the signal input 104 to form/output a first component 106, a second component 108, a third component 110, and a fourth component 112. For example, the first component 106 may be an In-Phase Modulator Component, the second component 108 may be a Quadrature Modulator Component, the third component 110 may be an In-Phase Carrier Component, and the fourth component 112 may be a Quadrature Carrier Component.

In current embodiments of the present invention, the system 102 may include a first modulator 114 and a second modulator 116. For example, the first modulator 114 and/or the second modulator 116 may be implemented as a switching mode power supply. The first modulator 114 may be configured for being connected (ex.—electrically connected) to the signal separator 102. The first modulator 114 may be further configured for receiving the first component 106 (such as from the signal separator 102 via an in-phase processing path) and amplifying the first component 106 to form/output a first modulator output 118. For instance, the first modulator output 118 may be a high/higher power level replica/version of the first component 106. In further embodiments, the system 102 may include a second modulator 116. The second modulator 116 may be configured for being connected (ex.—electrically connected) to the signal separator 102. The second modulator 116 may be further configured for receiving the second component 108 (such as from the signal separator 102 via a quadrature processing path) and amplifying the second component 108 to form/output a second modulator output 120. For example, the second modulator output 120 may be a high/higher power level replica/version of the second component 108. In additional embodiments, the first modulator 114 may be configured for receiving a first Direct Current (DC) power input 122 and the second modulator 116 may be configured for receiving a second DC power input 124.

In exemplary embodiments of the present invention, the system 102 may include a first saturated amplifier 126 and a second saturated amplifier 128. For example, the first saturated amplifier 126 and/or the second saturated amplifier 128 may be implemented using high speed RF switching transistors. The first saturated amplifier 126 may be configured for being connected to the signal separator 102 and the first modulator 114. The first saturated amplifier 126 may be further configured for receiving the third component 110 (such as from the signal separator 102 via an in-phase processing path) and increasing a power level of the third component 110 to form/output a first amplifier output 130. The second saturated amplifier 128 may be configured for being connected to the signal separator 102 and the second modulator 116. The second saturated amplifier 128 may be further configured for receiving the fourth component 112 (such as from the signal separator 102 via a quadrature processing path) and increasing a power level of the fourth component 112 to form/output a second amplifier output 132.

In current embodiments of the present invention, the first amplifier output 130 may be a constant-envelope square wave version of the third component 110 impressed on a carrier at a desired center frequency of RF transmission. Further, the second amplifier output 132 may be a constant-envelope square wave version of the fourth component 112 impressed on a carrier at a desired center frequency of RF transmission.

In additional embodiments of the present invention, the first saturated amplifier 126 may be configured for receiving the first modulator output 118 and may be further configured to act as a multiplier and multiply the first modulator output 118 to form/output a third amplifier output 134. The third amplifier output 134 may be a high/higher power replica/version of the first component 106 and/or the first modulator output 118 except that the carrier of the third amplifier output 134 is a square wave instead of a sinusoid. Further, the second saturated amplifier 128 may be configured for receiving the second modulator output 120 and may be further configured to act as a multiplier and multiply the second modulator output 120 to form/output a fourth amplifier output 136. The fourth amplifier output 136 may be a high/higher power replica/version of the second component 106 and/or the second modulator output 120 except that the carrier of the fourth amplifier output 136 is a square wave instead of a sinusoid.

In exemplary embodiments of the present invention, the system 100 may include a combiner 138. For example, the combiner 138 may be a two-way combiner. The combiner 138 may be configured for being connected to the first saturated amplifier 126 and the second saturated amplifier 128. Further, the combiner 138 may be configured for receiving and combining the first amplifier output 130, the second amplifier output 132, the third amplifier output 134, and the fourth amplifier output 136 to form/output a combiner output 140. In additional embodiments, the combiner output 140 may be a high/higher power replica of the signal input 102, except that the carrier of the combiner output 140 is a square-wave instead of a sinusoid.

In current embodiments of the present invention, the system 100 may include a lowpass filter 142. The lowpass filter 142 may be configured for being connected to the combiner 138. The lowpass filter 142 may be further configured for removing harmonic noise content and broadband noise content/providing harmonic and broadband noise rejection to form an RF output 144 suitable for transmission.

In further embodiments, the system 100 may include a highpass filter 146. The highpass filter 146 may be configured for being connected to the combiner 138 and a load 148. The highpass filter 146 may be further configured for directing harmonic noise content and broadband noise content from the combiner output 140 to the load 148, thereby ensuring that the harmonic noise content and broadband noise content are not conveyed to the RF output 144 of the system 100. Further, the highpass filter 146 and load 148 may promote provision of constant load impedance at output port(s) of the first saturated amplifier 126 and/or the second saturated amplifier 128, said constant load impedance being independent of operating frequency.

In exemplary embodiments, the system 100 is configured for transmitting the RF output 144. In further embodiments, the system 100/QEA design/QEA topology of the present invention may be physically larger than traditional EER designs for a same output RF power level, due to implementing multiple/separate modulators (114, 116). However, each modulator/QEA modulator (114, 116) may be required to generate less output power than a single modulator used in traditional EER amplifiers. In further embodiments, amplitude and phase mismatches between the modulators (114, 116) of the system 100 may be accounted for by an equalization function, which may be easily implemented using Digital Signal Processing (DSP) techniques. In additional embodiments, the system 100 of the present invention may be implemented in a radio program with High Frequency (HF) or low Very High Frequency (VHF) transmissions.

Figure 2:
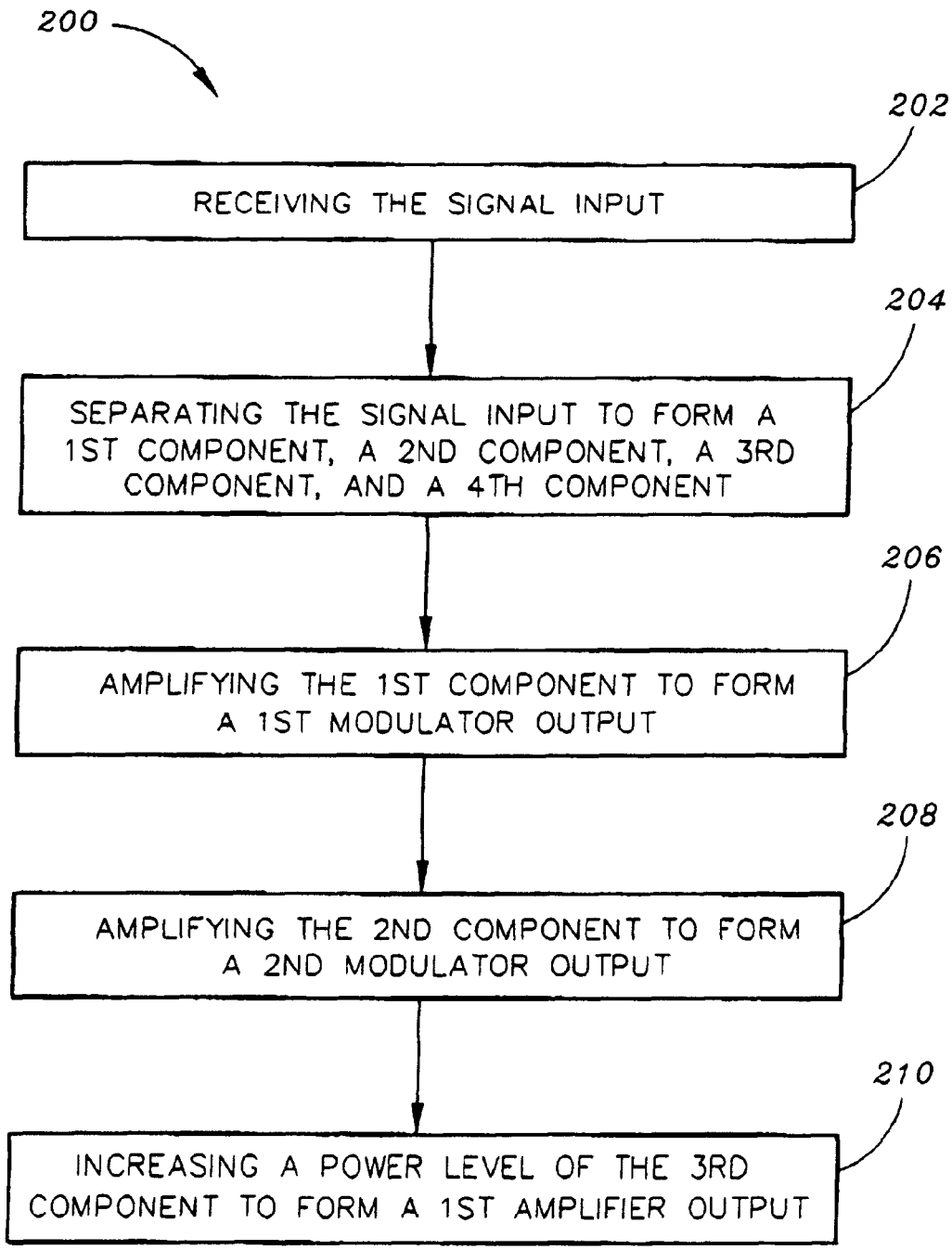
FIG. 2 is a flowchart illustrating a method for amplifying a signal input in accordance with an exemplary embodiment of the present invention.

Referring to FIG. 2, a flow chart illustrating a method for amplifying a signal input in accordance with an exemplary embodiment of the present invention is shown. In a current embodiment of the present invention, the method 200 may include receiving the signal input 202. The method 200 may further include separating the signal input to form a first component, a second component, a third component, and a fourth component 204. The method 200 may further include amplifying the first component to form a first modulator output 206. The method 200 may further include amplifying the second component to form a second modulator output 208.

In current embodiments of the present invention, the method 200 may further include increasing a power level of the third component to form a first amplifier output 210. The method 200 may further include increasing a power level of the fourth component to form a second amplifier output. The method 200 may further include increasing a power level of the first modulator output to form a third amplifier output. The method 200 may further include increasing a power level of the second modulator output to form a fourth amplifier output. The method 200 may further include combining the first amplifier output, the second amplifier output, the third amplifier output and the fourth amplifier output to form a combiner output.

In further embodiments of the present invention, the method 200 may further include filtering the combiner output to form a Radio Frequency (RF) output. For example, filtering the combiner output may include implementing the lowpass filter and/or the highpass filter as described above for preventing harmonic and broadband noise from being conveyed to the RF output. The method 200 may further include transmitting the RF output.

In exemplary embodiments, equations which define how the modified EER signal separator 102 carries out processing of/processes the signal input 104 are provided as follows:

Consider the general modulated signal expression $$y(t) = I(t) \cdot \cos[\omega(t) \cdot t + \phi(t)] + Q(t) \cdot \sin[\omega(t) \cdot t + \phi(t)] \quad (1)$$

By trigonometric identity, this can be rewritten as $$y(t) = I(t) \cdot \cos[\omega(t) \cdot t] \cdot \cos[\phi(t)] - I(t) \cdot \sin[\omega(t) \cdot t] \cdot \sin[\phi(t)] + \\ Q(t) \cdot \sin[\omega(t) \cdot t] \cdot \cos[\phi(t)] + Q(t) \cdot \cos[\omega(t) \cdot t] \cdot \sin[\phi(t)] \quad (2)$$

Now convert (2) to the discrete-time sampled domain $$y(t) = I(nT_s) \cdot \cos[\omega(nT_s) \cdot nT_s] \cdot \cos[\phi(nT_s)] - I(nT_s) \cdot \sin[\omega(nT_s) \cdot \\ nT_s] \cdot \sin[\phi(nT_s)] + Q(nT_s) \cdot \sin[\omega(nT_s) \cdot nT_s] \cdot \cos[\phi(nT_s)] + Q(nT_s) \cdot \\ \cos[\omega(nT_s) \cdot nT_s] \cdot \sin[\phi(nT_s)] \quad (3)$$

In this derivation, it is assumed that the carrier frequency equals one fourth of the sample rate. So rewrite the frequency term in (3) as follows $$\omega(nT_s) \cdot nT_s = \omega_c(nT_s) \cdot nT_s + \Delta\omega(nT_s) \cdot nT_s = \\ \frac{2\pi}{4 \cdot T_s} \cdot nT_s + \Delta\omega(nT_s) \cdot nT_s = n\pi/2 + \Delta\omega(nT_s) \cdot nT_s \quad (4)$$

Then back substitute (4) into (3) to obtain $$y(t) = I(nT_s) \cdot \cos[n\pi/2 + \Delta\omega(nT_s) \cdot nT_s] \cdot \cos[\phi(nT_s)] - \\ I(nT_s) \cdot \sin[n\pi/2 + \Delta\omega(nT_s) \cdot nT_s] \cdot \sin[\phi(nT_s)] + \\ Q(nT_s) \cdot \sin[n\pi/2 + \Delta\omega(nT_s) \cdot nT_s] \cdot \cos[\phi(nT_s)] + \\ Q(nT_s) \cdot \cos[n\pi/2 + \Delta\omega(nT_s) \cdot nT_s] \cdot \sin[\phi(nT_s)] \quad (5)$$

Using algebra and trigonometric identities, rewrite (5) as $$y(t) = I(nT_s) \cdot \cos[\Delta\omega(nT_s) \cdot nT_s + \phi(nT_s)] \cdot \cos[n\pi/2] - \\ I(nT_s) \cdot \sin[\Delta\omega(nT_s) \cdot nT_s + \phi(nT_s)] \cdot \sin[n\pi/2] + \\ Q(nT_s) \cdot \sin[\Delta\omega(nT_s) \cdot nT_s + \phi(nT_s)] \cdot \cos[n\pi/2] + \\ Q(nT_s) \cdot \cos[\Delta\omega(nT_s) \cdot nT_s + \phi(nT_s)] \cdot \sin[n\pi/2] \quad (6)$$

Equation (6) can be expressed as a sum of two product terms:

$$y(t) = IM_b(nT_s) \cdot IC_b(nT_s) + QM_b(nT_s) \cdot QC_b(nT_s) \quad (7)$$
where
$$IM_b(nT_s) = I(nT_s) \cdot \cos[\Delta\omega(nT_s) \cdot nT_s + \phi(nT_s)] + Q(nT_s) \cdot \sin[\Delta\omega(nT_s) \cdot nT_s + \phi(nT_s)]$$
$$QM_b(nT_s) = Q(nT_s) \cdot \cos[\Delta\omega(nT_s) \cdot nT_s + \phi(nT_s)] - I(nT_s) \cdot \sin[\Delta\omega(nT_s) \cdot nT_s + \phi(nT_s)]$$
and
$$IC_b(nT_s) = \cos[n\pi/2]$$
$$QC_b(nT_s) = \sin[n\pi/2]$$

Equation (7) defines the "bipolar" version of the modified EER signal separator equations, in which 1 Mb and QMb can take on positive or negative values at any sampling instant.

If the modulator component signals IM and QM are desired to be positive-valued only, the arithmetic sign of ICu and QCu can be modified to carry the information in the arithmetic sign of 1 Mb and QMb, such that IMu and QMu will always be "unipolar":

$$IM_u(nT_s) = |IM_b(nT_s)| \quad (8)$$
$$QM_u(nT_s) = |QM_b(nT_s)|$$
$$IC_u(nT_s) = \text{sgn}[IM_b(nT_s)] \cdot IC_b(nT_s)$$
$$QC_u(nT_s) = \text{sgn}[QM_b(nT_s)] \cdot QC_b(nT_s)$$

In further embodiments, a signal spectrum of the system/QEA 100 prior to output filtering may be derived as follows:

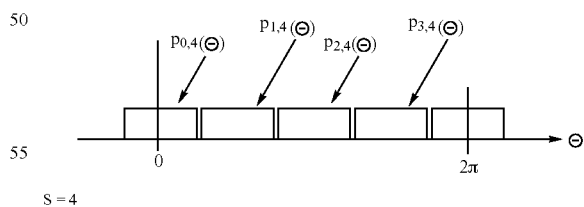

S = 4

$$p_{d,S}(\theta) = u\left[\theta - \left(-\frac{\pi}{S} + \frac{2\pi d}{S}\right)\right] - u\left[\theta - \left(\frac{\pi}{S} + \frac{2\pi d}{S}\right)\right]$$
$$d \in \{0, 1, \ldots S-1\}$$

-continued $$P_{d,S}(n) = \frac{1}{2\pi}\int p_{d,S}(\theta)\cdot\exp(-j\cdot n\cdot\theta)d\theta$$

$$= \frac{1}{2\pi}\int_{-\frac{\pi}{S}+\frac{2\pi d}{S}}^{+\frac{\pi}{S}+\frac{2\pi d}{S}}\exp(-j\cdot n\cdot\theta)d\theta = \frac{1}{\pi n}\cdot-\frac{1}{2j}\exp(-j\cdot n\cdot\theta)$$

$$\left|\begin{array}{l}+\frac{\pi}{S}+\frac{2\pi d}{S}\\-\frac{\pi}{S}+\frac{2\pi d}{S}\end{array}\right.$$

$$= \frac{1}{\pi n}\cdot\frac{1}{2j}\cdot\left\{\exp\left[-j\cdot n\cdot\left(+\frac{\pi}{S}+\frac{2\pi d}{S}\right)\right]-\exp\left[-j\cdot n\cdot\left(-\frac{\pi}{S}+\frac{2\pi d}{S}\right)\right]\right\}$$

$$= \frac{1}{\pi n}\cdot\frac{1}{2j}\cdot\left[\exp\left(-j\cdot\frac{\pi n}{S}\right)-\exp\left(+j\cdot\frac{\pi n}{S}\right)\right]\cdot\exp\left(-j\cdot\frac{2\pi dn}{S}\right)$$

$$\boxed{P_{d,S}(n) = \frac{1}{\pi n}\cdot\sin\left(\frac{\pi n}{S}\right)\cdot\exp\left(-j\cdot\frac{2\pi dn}{S}\right)}$$
$$d\in\{0,1,\ldots S-1\}$$

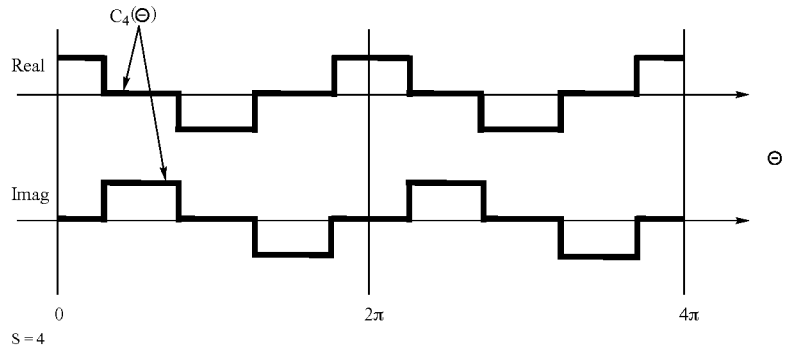

$S = 4$ $$\boxed{c_S(\theta) = \sum_{d=0}^{S-1}\exp\left(j\cdot\frac{2\pi d}{S}\right)\cdot P_{d,S}(\theta)}$$

$$C_S(n) = \sum_{d=0}^{S-1}\exp\left(j\cdot\frac{2\pi d}{S}\right)\cdot P_{d,S}(n)$$

$$= \frac{1}{\pi n}\cdot\sin\left(\frac{\pi n}{S}\right)\cdot\sum_{d=0}^{S-1}\exp\left(j\cdot\frac{2\pi d}{S}\right)\cdot\exp\left(-j\cdot\frac{2\pi dn}{S}\right)$$

$$= \frac{1}{\pi n}\cdot\sin\left(\frac{\pi n}{S}\right)\cdot\sum_{d=0}^{S-1}(e^{j2\pi d})^{\frac{1-n}{S}}$$

$$= \frac{1}{\pi n}\cdot\sin\left(\frac{\pi n}{S}\right)\cdot\{S\cdot\delta[\mathrm{mod}(1-n,S)]\}$$

$$\boxed{C_S(n) = \frac{S}{\pi n}\cdot\sin\left(\frac{\pi n}{S}\right)\cdot\delta[\mathrm{mod}(1-n,S)]}$$

In additional embodiments, a fundamental to total power ratio (FTPR) for the system 100 may be provided as follows:

FTPR measures the ratio of fundamental power to total power in the phasor generated by block pulses, as a function of the number of samples per cycle S with which the phasor is created. It is similar in nature to a total harmonic distortion measure.

$$\boxed{FTPR(S) = \frac{C_S^2(1)}{\sum_{m=0}^{\infty}C_S^2(m)}}$$

$$= \frac{\left[\frac{S}{\pi}\cdot\sin\left(\frac{\pi}{S}\right)\right]^2}{\sum_{m=0}^{\infty}\left\{\frac{S}{\pi m}\cdot\sin\left(\frac{\pi m}{S}\right)\cdot\delta[\mathrm{mod}(1-m,S)]\right\}^2}$$

$$= \frac{\left[\frac{S}{\pi}\cdot\sin\left(\frac{\pi}{S}\right)\right]^2}{\sum_{k=0}^{\infty}\left\{\frac{S}{\pi\cdot[kS+1]}\cdot\sin\left(\frac{\pi[kS+1]}{S}\right)\cdot\delta[\mathrm{mod}(1-[kS+1],S)]\right\}^2}$$

-continued $$= \frac{\left[\frac{S}{\pi}\cdot\sin\left(\frac{\pi}{S}\right)\right]^2}{\left\{\frac{S}{\pi}\cdot\left[\pm\sin\left(\frac{\pi}{S}\right)\right]\right\}^2\cdot\sum_{k=0}^{\infty}\left\{\frac{1}{kS+1}\right\}^2} = \frac{1}{\sum_{k=0}^{\infty}\left(\frac{1}{kS+1}\right)^2}$$

It is understood that the specific order or hierarchy of steps in the foregoing disclosed methods are examples of exemplary approaches. Based upon design preferences, it is understood that the specific order or hierarchy of steps in the method can be rearranged while remaining within the scope of the present invention. The accompanying method claims present elements of the various steps in a sample order, and are not meant to be limited to the specific order or hierarchy presented.

It is to be noted that the foregoing described embodiments according to the present invention may be conveniently implemented using conventional general purpose digital computers programmed according to the teachings of the present specification, as will be apparent to those skilled in the computer art. Appropriate software coding may readily be prepared by skilled programmers based on the teachings of the present disclosure, as will be apparent to those skilled in the software art. For example, it may be that, depending on the bandwidth of the signal to be amplified, a programmable Digital Signal Processor (DSP) may be implemented as part of/with the system 100 of the present invention for implementation of signal separation functions.

It is to be understood that the present invention may be conveniently implemented in forms of a software package. Such a software package may be a computer program product which employs a computer-readable storage medium including stored computer code which is used to program a computer to perform the disclosed function and process of the present invention. The computer-readable medium may include, but is not limited to, any type of conventional floppy disk, optical disk, CD-ROM, magnetic disk, hard disk drive, magneto-optical disk, ROM, RAM, EPROM, EEPROM, magnetic or optical card, or any other suitable media for storing electronic instructions. Further, the system 100 of the present invention may include/may implement a special-purpose embedded computer, such as a DSP or a Field Programmable Gate Array (FPGA), which may perform the above-referenced computations in real-time.

It is believed that the present invention and many of its attendant advantages will be understood by the foregoing description. It is also believed that it will be apparent that various changes may be made in the form, construction and arrangement of the components thereof without departing from the scope and spirit of the invention or without sacrificing all of its material advantages. The form herein before described being merely an explanatory embodiment thereof, it is the intention of the following claims to encompass and include such changes.

What is claimed is:

1. A system for amplifying a signal input, comprising:
    a signal separator configured for receiving the signal input and separating the signal input to form a first component, a second component, a third component, and a fourth component;
    a first modulator configured for being connected to the signal separator, the first modulator being further configured for receiving the first component and amplifying the first component to form a first modulator output;
    a second modulator configured for being connected to the signal separator, the second modulator being further configured for receiving the second component and amplifying the second component to form a second modulator output;
    a first saturated amplifier configured for being connected to the signal separator and the first modulator, the first saturated amplifier being further configured for receiving the third component and increasing a power level of the third component to form a first amplifier output; and
    a second saturated amplifier configured for being connected to the signal separator and the second modulator, the second saturated amplifier being further configured for receiving the fourth component and increasing a power level of the fourth component to form a second amplifier output.

2. A system as claimed in claim 1, wherein the first saturated amplifier is further configured for receiving the first modulator output and increasing a power level of the first modulator output to form a third amplifier output, the second saturated amplifier being configured for receiving the second modulator output and increasing a power level of the second modulator output to form a fourth amplifier output.

3. A system as claimed in claim 2, further comprising:
    a combiner, the combiner configured for being connected to the first saturated amplifier and the second saturated amplifier, the combiner being further configured for receiving and combining the first amplifier output, the second amplifier output, the third amplifier output, and the fourth amplifier output to form a combiner output.

4. A system as claimed in claim 3, further comprising:
    a highpass filter, the highpass filter configured for being connected to the combiner and a load, the highpass filter being further configured for directing harmonic noise content and broadband noise content from the combiner output to the load; and
    a lowpass filter, the lowpass filter configured for being connected to the combiner, the lowpass filter being further configured for removing harmonic noise content and broadband noise content from the combiner output to form a Radio Frequency (RF) output,
    wherein the system transmits the RF output.

5. A system as claimed in claim 1, wherein the first component is an In-Phase Modulator Component, the second component is a Quadrature Modulator Component, the third component is an In-Phase Carrier Component, and the fourth component is a Quadrature Carrier Component.

6. A system as claimed in 1, wherein the first modulator is configured for receiving a first Direct Current (DC) Power input and the second modulator is configured for receiving a second Direct Current (DC) Power input.

7. A system as claimed in claim 1, wherein at least one of the first amplifier output and the second amplifier output is a constant-envelope square wave output, the constant-envelope square wave output being impressed on a carrier at a desired center frequency of Radio Frequency (RF) transmission.

8. A system as claimed in claim 3, wherein the combiner output is a square wave carrier output.

9. A method for amplifying a signal input, comprising:
    receiving the signal input;
    separating the signal input to form a first component, a second component, a third component, and a fourth component;
    amplifying the first component to form a first modulator output;
    amplifying the second component to form a second modulator output;
    increasing a power level of the third component to form a first amplifier output;
    increasing a power level of the fourth component to form a second amplifier output;
    increasing a power level of the first modulator output to form a third amplifier output; and
    increasing a power level of the second modulator output to form a fourth amplifier output.

10. A method as claimed in claim 9, further comprising:
    combining the first amplifier output, the second amplifier output, the third amplifier output and the fourth amplifier output to form a combiner output.

11. A method as claimed in claim 10, further comprising:
    filtering the combiner output to form a Radio Frequency (RF) output.

12. A method as claimed in claim 11, further comprising:
    transmitting the RF output.

13. A system for amplifying a signal input, comprising:
    a signal separator configured for receiving the signal input and separating the signal input to form a first component, a second component, a third component, and a fourth component;

a first modulator configured for being connected to the signal separator, the first modulator being further configured for receiving the first component and amplifying the first component to form a first modulator output;

a second modulator configured for being connected to the signal separator, the second modulator being further configured for receiving the second component and amplifying the second component to form a second modulator output;

a first saturated amplifier configured for being connected to the signal separator and the first modulator, the first saturated amplifier being further configured for receiving the third component and increasing a power level of the third component to form a first amplifier output; and a second saturated amplifier configured for being connected to the signal separator and the second modulator, the second saturated amplifier being further configured for receiving the fourth component and increasing a power level of the fourth component to form a second amplifier output.

14. A system as claimed in claim 13, wherein the first saturated amplifier is further configured for receiving the first modulator output and increasing a power level of the first modulator output to form a third amplifier output, the second saturated amplifier being configured for receiving the second modulator output and increasing a power level of the second modulator output to form a fourth amplifier output.

15. A system as claimed in claim 14, further comprising:

a combiner, the combiner configured for being connected to the first saturated amplifier and the second saturated amplifier, the combiner being further configured for receiving and combining the first amplifier output, the second amplifier output, the third amplifier output, and the fourth amplifier output to form a combiner output.

16. A system as claimed in claim 15, further comprising:

a highpass filter, the highpass filter configured for being connected to the combiner and a load, the highpass filter being further configured for directing harmonic noise content and broadband noise content from the combiner output to the load; and a lowpass filter, the lowpass filter configured for being connected to the combiner, the lowpass filter being further configured for removing harmonic noise content and broadband noise content from the combiner output to form a Radio Frequency (RF) Output, wherein the system transmits the RF output.

17. A system as claimed in claim 13, wherein the first component is an In-Phase Modulator Component, the second component is a Quadrature Modulator Component, the third component is an In-Phase Carrier Component, and the fourth component is a Quadrature Carrier Component.

* * * * *